United States Patent
Barkhordarian

[19]

[11] Patent Number: 6,114,726
[45] Date of Patent: Sep. 5, 2000

[54] LOW VOLTAGE MOSFET

[75] Inventor: Vrej Barkhordarian, Glendale, Calif.

[73] Assignee: International Rectifier Corp., El Segundo, Calif.

[21] Appl. No.: 09/038,453

[22] Filed: Mar. 11, 1998

[51] Int. Cl.[7] .................................................. H01L 29/76
[52] U.S. Cl. .......................... 257/341; 257/342; 257/343; 257/401
[58] Field of Search ..................................... 257/341, 342, 257/343, 401

[56] References Cited

U.S. PATENT DOCUMENTS

| | | |
|---|---|---|
| 4,268,951 | 5/1981 | Elliott et al. . |
| 4,857,986 | 8/1989 | Kinugawa ................................. 357/42 |
| 4,883,767 | 11/1989 | Gray et al. . |
| 5,179,032 | 1/1993 | Quigg . |
| 5,285,094 | 2/1994 | Mori et al. . |
| 5,304,831 | 4/1994 | Yilmaz et al. . |
| 5,429,956 | 7/1995 | Shell et al. . |
| 5,429,964 | 7/1995 | Yilmaz et al. . |
| 5,436,481 | 7/1995 | Egawa ...................................... 257/324 |
| 5,460,985 | 10/1995 | Tokura et al. .............................. 437/40 |
| 5,494,843 | 2/1996 | Huang . |
| 5,677,218 | 10/1997 | Tseng . |

FOREIGN PATENT DOCUMENTS

| | | |
|---|---|---|
| 61-159767 | 7/1986 | Japan . |
| 4132265 | 5/1992 | Japan . |

OTHER PUBLICATIONS 1 micron Micron VLSI Technologypart II–Device Designs and Characteristics for High Performance Logic Applications, IEEE Journal of Solid–State Circuits, vol. Sc– 14, No. 2, Apr. 1979.

1 $\mu$m MOSFET VLSI Technology: Part II–Device Designs and Characteristics for High–Performance Logic Applications, IEEE Journal of Solid–State Circuits, vol. SC–14, No. 2 (Apr. 1979).

*Primary Examiner*—Carl Whitehead, Jr.
*Assistant Examiner*—Matthew E. Warren
*Attorney, Agent, or Firm*—Ostrolenk, Faber, Gerb & Soffen, LLP

[57] ABSTRACT

A low voltage planar MOSFET has a polyline width of less than 3.8 microns and a channel (base) region depth of less than 1.5 microns to produce a device having a reduced figure of merit (or product of $Q_{GD}$ and $R_{DSON}$).

20 Claims, 3 Drawing Sheets

(POLYSILICON)

LOW VOLTAGE MOSFET

BACKGROUND OF THE INVENTION

This invention relates to power MOSFET devices and more specifically relates to a novel low voltage power MOSFET with a minimized figure of merit for use in very low voltage applications with maximum efficiency.

Power MOSFETs are well known and a typical device and a process for its manufacture is described in U.S. Pat. No. 5,795,793 entitled PROCESS FOR MANUFACTURE OF MOS GATED DEVICE WITH REDUCED MASK COUNT issued to Daniel M. Kinzer. The device of that patent has a planar type geometry in that the invertible channels under the gate electrode are in a common plane with the surface of the silicon die containing the channel regions.

Another well known type of geometry used for power MOSFETs is the trench geometry in which the invertible channels are formed along the vertical walls of trenches etched into the silicon surface.

It was generally believed that the trench geometry is preferable to planar geometry for very low voltage MOSFET devices, for example, these having a reverse breakdown voltage of 30 volts or less. These very low voltage devices, which are commonly used in switch mode converters for providing a regulated d-c voltage from a battery for portable electronic devices such as lap top computers, should be as efficient as possible to permit maximum battery life. Thus, devices having the smallest possible figure of merit, which is the product of drain to gate charge $Q_{GD}$ and on-resistance $R_{DSON}$, are most desirable in these applications. The conventional wisdom of the art was that the trench geometry has an inherently smaller $Q_{GD}$ than a planar device; and that similarly reducing the $Q_{GD}$ of a planar geometry device would increase its $R_{DSON}$ to such an extent that the figure of merit of the planar structure would be unacceptably high for very low voltage ratings (lower than about 30 volts) application.

Trench devices, however, are difficult to manufacture at very low voltage ratings, because the threshold turn on voltage is low and very thin gate oxides, for example, gate oxides as low as 250 Å thick are needed. These very thin oxides must turn sharp corners in the trench device, leading to serious step coverage problems during manufacture. Consequently, the trench geometry has been very difficult to apply to devices rated at less than about 30 volts.

It would be very desirable to make a low voltage MOSFET, using planar geometry which inherently easily employs thinner gate oxides for reduced threshold turn on voltages, if the figure of merit did not become unduly high when reducing $Q_{GD}$, due to an unacceptable increase in $R_{DSON}$.

BRIEF DESCRIPTION OF THE INVENTION

In accordance with the invention, a novel planar MOSFET device geometry is provided, employing a reduced polysilicon line width (less than about 3.8 microns) and a base depth of less than about 1.5 microns. An increased polysilicon opening or window (for diffusion of the device base), of about 7.2 microns, and a base to base spacing of more than about 0.7 microns may also be used.

It has been found that the use of these dimensions provide a 50% reduction in $Q_{GD}$, as compared to the prior art process and structure for the device of U.S. Pat. No. 5,795,793 but, unexpectedly, an increase of only about 10% in $R_{DSON}$. The gate oxide thickness in the new device may be 250 Å or even thinner without experiencing manufacturing problems. Further, the known process, described in U.S. Pat. No. 5,795,793 can be used to manufacture the device of the present invention, changing the mask patterns only to produce the narrower polysilicon line width and polysilicon opening, and the adjusting the diffusion process to reduce the base depth.

Further, the device of the invention can use the hexagonal cell geometry, or can use any polygonal geometry, or, if desired, can use a stripe geometry.

In principle, the invention recognizes that at very low voltage and with very thin gate oxides, a planar MOSFET can be best designed by choosing a polysilicon line width and base depth which produces a minimized product of $Q_{GD}$ and $R_{DSON}$.

DETAILED DESCRIPTION OF THE DRAWINGS

Figure 1:
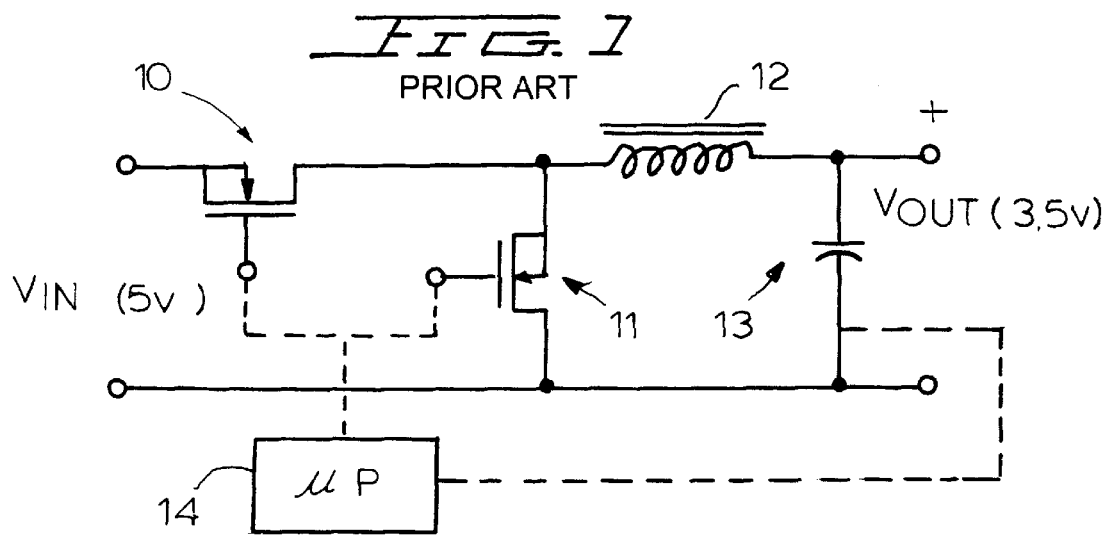
FIG. 1 shows a circuit diagram of a well known switch mode convertor (or "buck" converter) using very low voltage MOSFETs for providing an accurately regulated d-c voltage for a portable electronics device.

Referring first to FIG. 1, there is shown the circuit diagram of a well known switch-mode converter for providing an accurate output voltage $V_{OUT}$ from an input voltage $V_{IN}$, which can be a d-c battery. The circuit of FIG. 1 is conventionally employed for portable electronics devices, such as lap-top computers in which a battery provides a voltage $V_{IN}$, which is nominally 14 volts, but will vary with its state of charge, age, temperature and the like. A highly regulated output voltage $V_{OUT}$ (1.8 volts) is required, however, for the device operation. The circuit of FIG. 1 employs a "top" MOSFET 10, a recirculating MOSFET 11, an inductor 12, an output capacitor 13 and a microprocessor chip 14. The microprocessor (also referred to as the control Ic) provides signals for turning on and off the MOSFETs 10 and 11 at a frequency and with a suitable timing and with a controlled conduction period to maintain a constant output voltage.

The top MOSFET 10 has a power loss which will reduce the efficiency of the circuit, and thus the life of battery source $V_{IN}$ (before charging is needed). Therefore, it is essential to use a MOSFET for device 10 which has the smallest possible switching and conduction loss. The need for a low figure of merit to improve efficiency also becomes greater as the difference between input and output voltage increases. Note that small switching loss MOSFETs at low voltage (under about 30 volts) have numerous applications, and the device 10 in the circuit of FIG. 1 is but one typical application.

Figure 2:
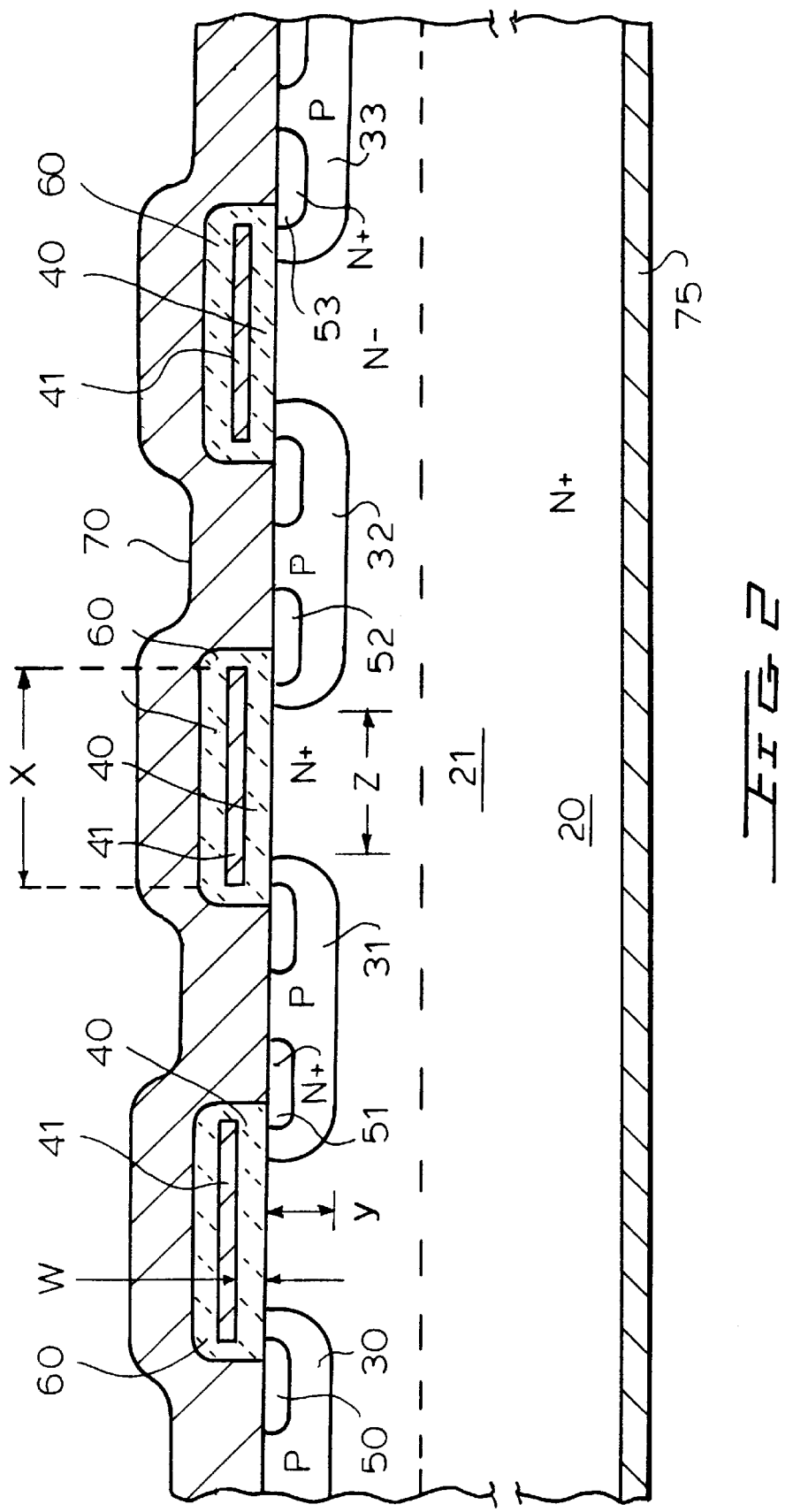
FIG. 2 is a cross-section of a small portion of the active area of planar MOSFET of the present invention which can be used in the circuit of FIG. 1.
Figure 3:
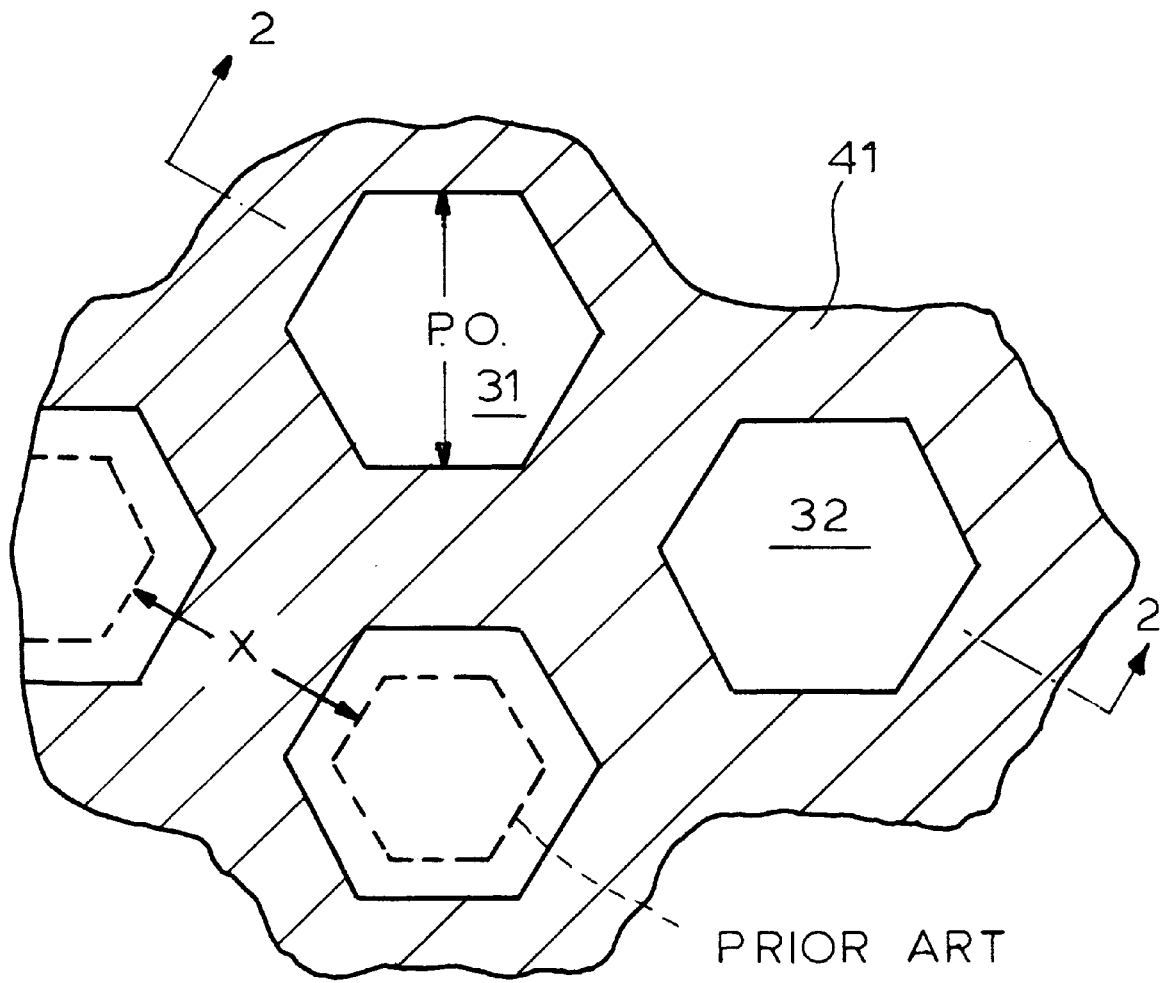
FIG. 3 is a schematic cross-section of FIG. 2, taken across section line 3—3 in FIG. 2, showing only the polysilicon gate electrode pattern.

FIGS. 2 and 3 show a portion of a multicellular planar type of vertical conduction MOSFET which can have thousands of parallel connected cells in its active area.

Only a few of these cells are shown in FIGS. 2 and 3. U.S. Pat. No. 5,795,793 shows a typical prior art device in more detail, along with a process for its manufacture. The disclosure of this application is incorporated herein by reference and the process disclosed therein can be used in large measure to carry out the present invention.

FIG. 2 shows, in cross-section, the device which has a main N+ silicon body 20 which has an epitaxially deposited, N− junction receiving layer 21 thereon.

The N− layer 21 has a thickness and concentration dependent upon the reverse voltage rating of the device. By way of example, for a device rated at 200 volts, the layer 21 will have a thickness of 25–30 μm microns and a resistivity of about 4.5 ohm cm. However, for the device of the invention, rated at less than about 30 volts, the layer 21 has a thickness of about 5 microns and a resistivity of about 0.2 ohm cm.

A plurality of spaced P type base cells 30, 31, 32 and 33 are diffused into the upper surface of layer 21 as shown. During the manufacturing process a thin gate oxide layer is grown, shown as gate oxide elements 40 in FIG. 2, and a conductive polysilicon layer 41 is deposited over the gate oxide layer 40. The polysilicon layer 41 and gate oxide layer 40 are then suitably lithographically patterned and etched to open polygonal windows to enable the diffusion of P type bases 30 to 33 and their respective annular N+ source region rings 50, 51, 52 and 53.

An interlayer, or low temperature oxide 60 is then deposited atop the polysilicon layer 41 to "encapsulate" and insulate the web-shaped polysilicon 41. The layer 60 is then etched to open contact windows, and a source electrode 70 is deposited atop the device surface, insulated from the polysilicon layer 41 but connected to each source of each cell and to its corresponding P type base.

A drain electrode 75 is then attached to the bottom of N+ region 20.

The device geometry shown is well known and may be made by the process described in U.S. Pat. No. 5,795,793. However, in accordance with the present invention, the selection of novel dimensions for the polysilicon line width X, and base cell depth Y, makes the figure of merit $Q_{GD} \cdot R_{DSON}$ unexpectedly small.

In more detail, the resistance $R_{DSON}$ in the structure of FIG. 2 is controlled principally by the amount of the JFET pinch in the common conduction region between spaced bases. This channel has the width "Z" in FIG. 2, and when very small, is easily fully depleted during forward conduction, producing a very high effective on resistance. The distance Z is equal to the polysilicon line width X, reduced by the amount of lateral diffusion of the base region under the polysilicon (since the polysilicon defines the diffusion window for the base). This lateral diffusion is approximately 80% of the base depth.

Figure 4:
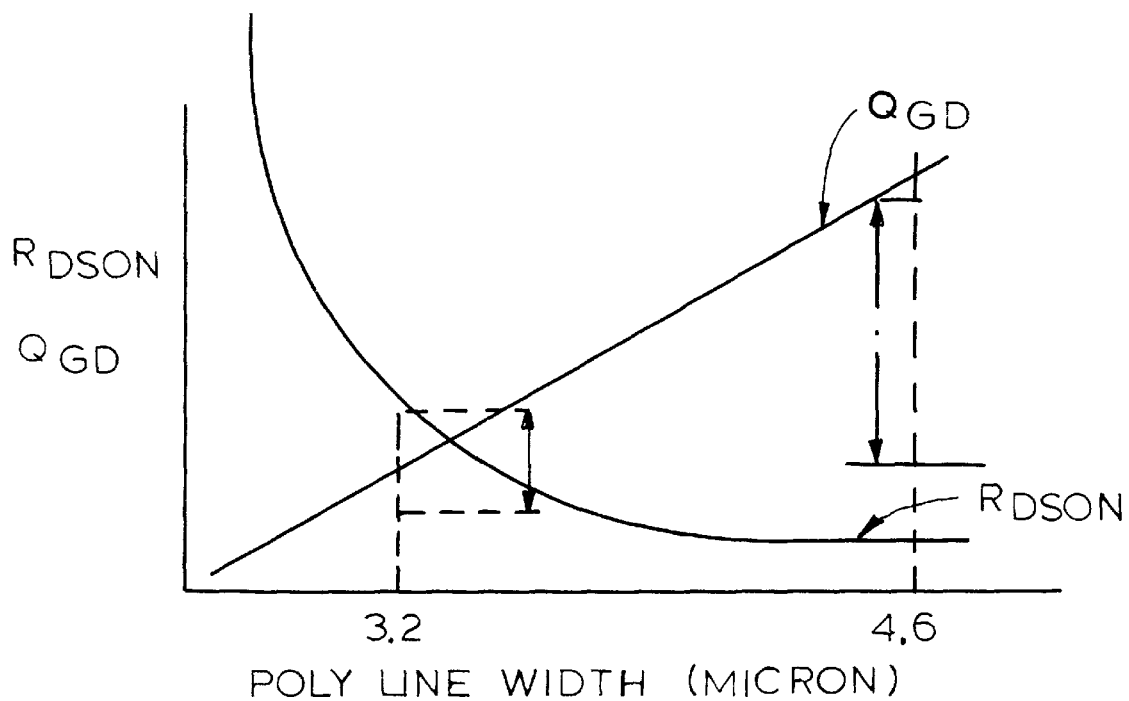
FIG. 4 shows a graph of $R_{DSON}$ and $Q_{GD}$ as a function of polysilicon line width.

The distance Z should be kept greater than about 0.7 microns since a smaller space causes an extreme increase in resistance due to the JFET effect, as shown in FIG. 4 which shows the change of $R_{DSON}$ as a function of polysilicon line width. It can be seen that $R_{DSON}$ increases asymptotically at small polyline widths.

The $Q_{GD}$ of the device is also related to the distance Z and is thus is also related to polyline width X, taking base depth and lateral base diffusion into account. FIG. 4 also shows $Q_{GD}$ varying linearly with Z (the polyline width X reduced by lateral base diffusion).

Thus, it can be seen that a reduction of $Q_{GD}$ to reduce figure of merit in a planar MOSFET will increase $R_{DSON}$ with a non-linear function. For this reason, it has been the conventional wisdom of the art that the low inherent $Q_{GD}$ properties of trench devices made them the preferred device for low voltage FETs despite the difficulty of making the trench device with a very thin gate oxide.

In accordance with the invention, it has been found that the use of a polysilicon line width "X" less than 3.8 microns (preferably 3.2 microns) and a base depth "Y" of less than 1.5 microns and a polysilicon opening "PO" of about 7.2 microns produces a low voltage MOSFET with a minimized figure of merit. More specifically a known low voltage planar device made by the process of U.S. Pat. No. 5,795,793 used a polyline width ("X" in FIG. 3) of 4.6 microns and a poly opening "PO" of 5.8 microns and a base depth of 1.8 microns. By simply reducing the line width to 3.2 microns (thus increasing P.O. to 7.2 microns) and reducing the base depth to 1.5 microns, the $Q_{GD}$ was reduced by 50%. Unexpectedly, the $R_{DSON}$ increased by only 10%, whereby the product of $Q_{GD}$ and $R_{DSON}$ was reduced to below that obtained by similarly rated trench devices.

Note that in the new device, the gate oxide 41 was only 250 Å, but this produces no manufacturing or step coverage problem, as with the trench process.

Although the present invention has been described in relation to particular embodiments thereof, many other variations and modifications and other uses will become apparent to those skilled in the art. It is preferred, therefore, that the present invention be by the appended claims.

What is claimed is:

1. A low voltage planar power MOSFET comprising:
   a silicon wafer having a junction receiving surface;
   at least first and second shallow spaced base diffusions of one conductivity type formed in said junction receiving surface and spaced by a common conduction region of said wafer;
   each of said first and second bases having a respective source region of the other conductivity type diffused therein, each source region being substantially wholly contained within a respective base to define at least first and second spaced substantially, coplanar invertible channel regions, said first and second bases having a diffusion depth of less than about 1.5 microns;
   a thin gate insulation layer overlying said invertible channel regions and the surface of said common conduction region between said invertible channel regions; and
   a conductive polysilicon gate electrode layer overlying said gate insulation layer; wherein
   the polysilicon line width of said polysilicon layer measured in the direction spanning across said common conduction region is between about 0.7 microns and about 3.8 microns.

2. The MOSFET of claim 1 wherein said gate insulation layer has a thickness less than about 250 Å.

3. The MOSFET of claim 1 which further includes a source electrode connected to each of said source regions and each of said base regions, and a drain electrode connected to said silicon wafer.

4. The MOSFET of claim 1 wherein said silicon wafer comprises a highly conductive substrate and an epitaxially deposited layer of silicon atop said highly conductive substrate; said junction receiving surface being defined at the top of said epitaxially deposited layer.

5. The MOSFET of claim 1 wherein each of said bases have a polygonal topology and wherein each of said source regions define annular rings within their respective base.

6. The MOSFET of claim 5 wherein said polysilicon layer has openings therein which are atop and aligned with each of said bases to expose an interior portion of each of said annular source rings and the surface portion of each said base which is enclosed by a respective one of said annular source rings.

7. A planar MOSFET having a breakdown voltage lower than about 30 volts, said MOSFET comprising:

a silicon wafer having a junction receiving surface;

a plurality of symmetrically spaced polygonal base diffusions of one conductivity type formed in said junction receiving surface, each of said bases having a diffusion depth less than about 1.5 microns;

the material of said wafer disposed between said bases defining a common conduction region for the vertical conduction of charge carriers across at least a portion of the thickness of said wafer;

each of said bases having an annular source diffusion therein to define a polygonal invertible channel region around periphery of each of said bases;

a thin gate insulation layer lattice which overlies each of said invertible channel regions and the surface of said common conduction region;

a conductive polysilicon electrode layer in substantial registry with and overlying said gate insulation member;

the polysilicon line width of said polysilicon layer as measured in a direction across said common conduction region being between about 0.7 microns and about 3.8 microns.

8. The MOSFET of claim 7 wherein said gate insulation layer has a thickness less than about 250 Å.

9. The MOSFET of claim 7 wherein said gate insulation layer has a thickness less than about 250 Å.

10. The MOSFET of claim 9 wherein said gate insulation layer has a thickness less than about 250 Å.

11. The MOSFET of claim 7 which further includes a source electrode connected to each of said source regions and each of said base regions, and a drain electrode connected to said silicon wafer.

12. The MOSFET of claim 7 which further includes a source electrode connected to each of said source regions and each of said base regions, and a drain electrode connected to said silicon wafer.

13. The MOSFET of claim 10 which further includes a source electrode connected to each of said source regions and each of said base regions, and a drain electrode connected to said silicon wafer.

14. The MOSFET of claim 7 wherein said silicon wafer comprises a highly conductive substrate on an epitaxially deposited layer of silicon atop said highly conductive substrate; said junction receiving surface being defined at the top of said epitaxially deposited layer.

15. The MOSFET of claim 7 wherein said silicon wafer comprises a highly conductive substrate on an epitaxially deposited layer of silicon atop said highly conductive substrate; said junction receiving surface being defined at the top of said epitaxially deposited layer.

16. The MOSFET of claim 8 wherein said silicon wafer comprises a highly conductive substrate on an epitaxially deposited layer of silicon atop said highly conductive substrate; said junction receiving surface being defined at the top of said epitaxially deposited layer.

17. The MOSFET of claim 10 wherein said silicon wafer comprises a highly conductive substrate on an epitaxially deposited layer of silicon atop said highly conductive substrate; said junction receiving surface being defined at the top of said epitaxially deposited layer.

18. The MOSFET of claim 7 wherein said polysilicon layer has openings disposed atop and aligned with each of said bases to expose an interior portion of each of said annular source rings and the surface portion of each said base which is enclosed by a respective one of said annular source rings.

19. The MOSFET of claim 11 wherein said polysilicon layer has openings disposed atop and aligned with each of said bases to expose an interior portion of each of said annular source rings and the surface portion of each said base which is enclosed by a respective one of said annular source rings.

20. A power MOSFET comprising:

a polysilicon gate;

a channel region;

a source region; and a drain region;

said polysilicon gate having a polysilicon line width;

said power MOSFET having a gate to drain capacitance which produces a gate to drain charge QGD;

said power MOSFET having an on resistance between said source region and said drain region expressed as RDSON;

the value of QGD being generally a linear function of said polysilicon line width;

the value of RDSON being non-linearly related to said polysilicon line width; and said polysilicon line width being between about 0.7 microns and about 3.8 microns, chosen to minimize the product of QGD and RDSON.

* * * * *